(12) United States Patent
Ozaki et al.

(10) Patent No.: US 8,388,929 B2
(45) Date of Patent: Mar. 5, 2013

(54) ALPHA ALUMINA FOR THE PRODUCTION OF SAPPHIRE SINGLE CRYSTAL AND METHOD FOR PRODUCING THE SAME

(75) Inventors: Hirotaka Ozaki, Niihama (JP); Shinji Fujiwara, Niihama (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/041,833

(22) Filed: Mar. 7, 2011

(65) Prior Publication Data

US 2011/0223423 A1 Sep. 15, 2011

(30) Foreign Application Priority Data

Mar. 9, 2010 (JP) ................................. 2010-051427

(51) Int. Cl.
*C01F 7/00* (2006.01)
(52) U.S. Cl. ...................................................... 423/625
(58) Field of Classification Search ................... 423/625
See application file for complete search history.

(56) References Cited

U.S. PATENT DOCUMENTS

2010/0040535 A1 * 2/2010 Azima et al. .................. 423/625

FOREIGN PATENT DOCUMENTS

| JP | 5-97569 A | 4/1993 |
| WO | 2008/035656 | * 3/2008 |

* cited by examiner

*Primary Examiner* — Steven Bos
(74) *Attorney, Agent, or Firm* — Sughrue Mion, PLLC

(57) ABSTRACT

An object of the present invention is to provide α alumina for the production of a sapphire single crystal, capable of producing a sapphire single crystal with high production efficiency; and a method for producing the same.

Disclosed are α alumina for the production of a sapphire single crystal, including 100 parts by weight of α alumina (I) and 25 to 235 parts by weight of α alumina (II), wherein the α alumina (I) has a specific surface area of 0.1 to 5 m²/g and a bulk density of 1.5 g/cm³ or more, the α alumina (II) is composed of sintered particles and also has a specific surface area of 1 m²/g or less and a relative density of 85% or more, and each of the body particles has a volume of 0.01 cm³ or more; and a method for producing the same.

5 Claims, No Drawings

ALPHA ALUMINA FOR THE PRODUCTION OF SAPPHIRE SINGLE CRYSTAL AND METHOD FOR PRODUCING THE SAME

BACKGROUND OF THE INVENTION

1. Field of the Invention

The present invention relates to α alumina (alpha alumina) for the production of a sapphire single crystal, and a method for producing the same.

2. Description of the Related Art

α alumina is useful as a raw material for the production of a sapphire single crystal. The sapphire single crystal can be produced, for example, by a method of filling α alumina in a crucible made of metallic molybdenum, heating to melt the α alumina, and pulling up from the melted alumina (see, for example, JP H05-97569A). In order to efficiently produce a sapphire single crystal by filling α alumina in a crucible with high volume efficiency, α alumina capable of being filled in a crucible with higher volume efficiency is required.

SUMMARY OF THE INVENTION

An object of the present invention is to provide α alumina for the production of a sapphire single crystal, capable of producing a sapphire single crystal with high production efficiency; and a method for producing the same.

The inventors of the present invention have intensively studied so as to achieve the above object and found solution means comprising the following constitutions, and thus the present invention has been completed.

(1) α alumina for the production of a sapphire single crystal, including 100 parts by weight of α alumina (I) and 25 to 235 parts by weight of α alumina (II), wherein the α alumina (I) has a specific surface area of 0.1 to 5 m$^2$/g and a bulk density of 1.5 g/cm$^3$ or more; and wherein the α alumina (II) is composed of sintered particles, and also has a specific surface area of 1 m$^2$/g or less and a relative density of 85% or more, and each of the sintered particles has a volume of 0.01 cm$^3$ or more.

(2) The α alumina for the production of a sapphire single crystal according to (1), wherein the α alumina (I) exhibits one or more frequency maximums in a particle diameter range of 100 μm or more and less than 850 μm in particle size distribution on a weight basis of a dry sieving particle diameter, determined in a dry sieving test in accordance with JIS K 0069 (1992).

(3) The α alumina for the production of a sapphire single crystal according to (1) or (2), wherein the α alumina (I) contains 10% by weight or less of particles having a particle diameter of 850 μm or more and less than 1 mm in particle size distribution, wherein the α alumina (I) exhibits one or more frequency maximums (A) in a particle diameter range of 100 μm or more and less than 850 μm and the α alumina (I) exhibits one or more frequency maximums (B) in a particle diameter range of 1 mm or more, and wherein when D1 denotes a maximum particle diameter of a frequency maximum showing the smallest maximum particle diameter among the frequency maximums (A), M1 denotes a maximum value of a frequency maximum showing the smallest maximum particle diameter among the frequency maximums (A), D2 denotes a maximum particle diameter of a frequency maximum showing the largest maximum particle diameter among the frequency maximums (B) and M2 denotes a maximum value of a frequency maximum showing the largest maximum particle diameter among the frequency maximums (B), D1 and D2 satisfy the inequality expression: 2×D1≦D2≦20×D1 and a ratio of M1 to M2 (M1/M2) is 0.05 or more.

(4) The α alumina for the production of a sapphire single crystal according to any one of (1) to (3), wherein the α alumina has a purity is 99.99% by weight or more and each content of Si, Na, Ca, Fe, Cu and Mg is 10 ppm or less (by weight).

(5) A method for producing α alumina for the production of a sapphire single crystal, which includes the step of mixing 100 parts by weight of α alumina (I) with 25 to 235 parts by weight of α alumina (II), wherein the α alumina (I) has a specific surface area of 0.1 to 5 m$^2$/g and a bulk density of 1.5 g/cm$^3$ or more, and the α alumina (II) is composed of sintered particles, the α alumina (II) has a specific surface area of 1 m$^2$/g or less and a relative density of 85% or more, and each of the sintered particles has a volume of 0.01 cm$^3$ or more.

The "dry sieving particle diameter" in the present invention is a maximum value of a sieve mesh size of a standard sieve through which the α alumina (I) could not pass when the α alumina is sieved using a standard sieve defined in JIS Z 8801 (1987).

Since the present invention enables filling in a crucible with high volume efficiency, the effect capable of producing a sapphire single crystal with high production efficiency is exerted.

DETAILED DESCRIPTION OF THE INVENTION

[α Alumina for the Production of Sapphire Single Crystal]

α alumina for the production of a sapphire single crystal of the present invention (hereinafter referred to as "α alumina for the production of a single crystal") contains 100 parts by weight of α alumina (I), and 25 to 235 parts by weight, preferably 50 to 150 parts by weight, and more preferably 100 parts by weight, of α alumina (II). When α alumina (I) and α alumina (II) are contained in this ratio, bulk density of the α alumina for the production of a single crystal can be increased.

The inventors of the present application have found that a bulk density of the α alumina for the production of a single crystal extremely increases by mixing two α aluminas each having a different characteristics (α alumina (I) and α alumina (II)) in the above ratio. Namely, the α alumina (II) can reconcile comparatively large volume and a high relative density and it has such a feature that each of sintered particles has a high bulk density since it is composed of sintered particles having a uniform shape. As described in detail hereinafter, such characteristics can be obtained by defining a range of a specific surface area, a range of a relative density and a range of a volume.

On the other hand, the α alumina (I) can reconcile comparatively high bulk density and a high fluidity and also can sufficiently decrease a closed porosity. As described in detail hereinafter, such characteristics can be obtained by defining a range of a specific surface area and a range of a bulk density.

Thus, it becomes possible for the α alumina for the production of a single crystal of the present invention, in which the α alumina (I) having sufficient bulk density and fluidity exists between sintered particles of the α alumina (II) having such a form in the above weight ratio, to have extremely high bulk density.

The α alumina (I) and the α alumina (II) will be described in detail below.

<α Alumina (I)>

The α alumina (I) is usually in the form of a powder. The α alumina (I) preferably has a purity of 99.99% by weight or more. Each content of Si, Na, Ca, Fe, Cu and Mg in the α alumina (I) is preferably 10 ppm or less by weight.

The α alumina (I) has a specific surface area of 0.1 to 5 $m^2/g$, and preferably 0.2 to 1 $m^2/g$. The α alumina (I) has a bulk density of 1.5 $g/cm^3$ or more, preferably 2.0 $g/cm^3$ or more, and more preferably 2.0 to 2.6 $g/cm^3$. When the α alumina (I) has too large specific surface area and too small bulk density, the fluidity of the α alumina (I) may deteriorate and also handling properties may deteriorate. Also, the α alumina (I) has too small specific surface area, closed porosity may increase and moisture incorporated into closed pores may cause oxidation of a crucible.

In order to fill the α alumina for the production of a single crystal in a crucible with high bulk density, the α alumina (I) preferably has a relative density of 55 to 90%, a closed porosity of 0 to 10%, and an amount of adsorbed moisture of 0 to 1% by weight. When the relative density is within the above range, it is easy to obtain a alumina (I) having a specific surface area and a bulk density defined in the present invention. When the closed porosity increases over the above range, moisture incorporated into closed pores may cause oxidation of a crucible. Also, when the mount of adsorbed moisture increases over the above range, adsorbed moisture may cause oxidation of a crucible.

The content of particles having a particle diameter (diameter) of more than 2.8 mm in the α alumina (I) is preferably 15% by weight or less, and more preferably 10% by weight or less. Particularly, it is preferred that the α alumina (I) does not substantially contain particles having a particle diameter (diameter) of more than 2.8 mm (for example, the content is about 0.1% by weight or less). When the content of particles having a particle diameter (diameter) of more than 2.8 mm exceeds the above range, it becomes difficult to obtain α alumina (I) having a bulk density defined in the present invention.

The α alumina (I) preferably exhibits one or more frequency maximums in a particle diameter range of 100 μm or more and less than 850 μm in particle size distribution, and more preferably exhibits one or more frequency maximums in a particle diameter range of 100 μm or more and less than 500 μm. The α alumina (I) may contain particles having a single particle diameter. When one or more frequency maximums exist in the above range, it is easy to obtain α alumina (I) having a bulk density defined in the present invention It is preferred that the content of particles having a particle diameter of 850 μm or more and less than 1 mm of the α alumina (I) in particle size distribution is 10% by weight or less, and when the α alumina (I) exhibits one or more frequency maximums (A) in a particle diameter range of 100 μm or more and less than 850 μm, preferably 100 μm or more and less than 500 μm, D1 denoting a maximum particle diameter of a frequency maximum showing the smallest maximum particle diameter among frequency maximums (A), M1 denoting a maximum value of a frequency maximum showing the smallest maximum particle diameter among frequency maximums (A), and when the α alumina (I) preferably exhibits one or more frequency maximums (B) in a particle diameter range of 1 mm or more, preferably 1 mm or more and less than 2 mm, D2 denoting a maximum particle diameter of a frequency maximum showing the largest maximum particle diameter among frequency maximums (B), M2 denoting a maximum value of a frequency maximum showing the largest maximum particle diameter among frequency maximums (B), D1 and D2 satisfy the inequality expression: $2 \times D1 \leqq D2 \leqq 20 \times D1$ and a ratio of M1 to M2 (M1/M2) is 0.05 or more. Thereby, the a alumina for the production of a single crystal can be filled in a crucible with higher bulk density.

It is particularly preferred that D1 and D2 satisfy the inequality expression: $5 \times D1 \leqq D2 \leqq 15 \times D1$. The ratio of M1 to M2 (M1/M2) is preferably 0.1 or more, more preferably 1 or more, and still more preferably 1 to 5.

In the present specification, the particle diameter is a dry sieving particle diameter to be measured as a maximum value of a sieve mesh size through which the α alumina (I) could not pass when the α alumina is sieved using standard sieves each having a sieve mesh size 75 μm, 100 μm, 212 μm, 300 μm, 425 μm, 500 μm, 600 μm, 710 μm, 850 μm, 1 mm, 2 mm or 2.8 mm defined in JIS Z 8801 (1987). The particle size distribution is particle size distribution, on a weight basis, by a dry sieving particle diameter to be measured in accordance with a dry sieving test defined in JIS K 0069 (1992) using a standard sieve.

The α alumina (I) can be prepared, for example, by a method including the following steps (I-1) to (I-3):

step (I-1) of mixing an α alumina precursor with α alumina seed particles to obtain a mixture, step (I-2) of calcining the mixture to obtain a coarse powder, and step (I-3) of classifying the coarse powder.

(α Alumina Precursor)

An α alumina precursor is a compound capable of converting into α alumina by calcining, and examples thereof include aluminum alkoxides such as aluminum hydroxide, aluminum isopropoxide, aluminum ethoxide, aluminum s-butoxide and aluminum t-butoxide; and transition aluminas such as γ alumina, δ alumina and θ alumina. These α alumina precursors may be used alone, or one, or two or more kinds of them may be used in combination. Among these α alumina precursors, aluminum hydroxide is preferable, and high-purity aluminum hydroxide having a purity of 99.99% by weight or more are more preferable.

The aluminum hydroxide is obtained, for example, by hydrolyzing a hydrolyzable aluminum compound. Examples of the hydrolyzable aluminum compound include aluminum alkoxide and aluminum chloride and the like, and aluminum alkoxide is preferable from the viewpoint of the purity. The aluminum hydroxide has a crystal structure of amorphous, gibbsite or boehmite, and preferably boehmite.

(α Alumina Seed Particles)

α alumina seed particles are obtained, for example, by grinding high-purity α alumina particles having a purity of 99.99% by weight or more. The α alumina seed particles preferably have a central particle diameter of 0.1 to 1 μm, and more preferably 0.1 to 0.4 μm. It is industrially difficult to produce α alumina seed particles having too small central particle diameter. It is not preferred that the α alumina seed particles have too large central particle diameter since the specific surface area and the bulk density of the α alumina (I) may deviate from a intended value.

Examples of the method of grinding high-purity a alumina particles include a method of grinding in a dry state (dry grinding method), a method of adding a solvent and grinding in a state of a slurry (wet grinding method) and the like, and a wet grinding method is preferable.

In the wet grinding method, for example, grinders such as a ball mill, a medium stirring mill are used. The solvent is usually water. In the wet grinding method, in order to improve dispersibility, a dispersing agent can be added. The dispersing agent is preferably a material capable of being vaporized as a result of decomposition by calcining, for example, a polymeric dispersing agent such as a polyacrylic acid ammonium salt, so as to reduce impurities of the α alumina (I).

In order to reduce contamination of α alumina seed particles, it is preferred that a surface in contacted with alumina of a member of grinders is made of high-purity α alumina, or lined with a resin. When the medium stirring mill is used, the medium is also preferably high-purity α alumina.

The amount of the α alumina seed particles is usually from 0.1 to 10 parts by weight, and preferably from 0.3 to 7 parts by weight, when the weight of the α alumina particles after calcining is 100 parts by weight. It is not preferred that the amount of the α alumina seed particles is too small since the specific surface area and the bulk density of the α alumina (I) may deviate from a intended value. It is not also preferred that the amount of the α alumina seed particles is too large since physical properties of the obtained α alumina (I) remain unchanged and the use amount increased needlessly.

The α alumina seed particles are usually mixed with aluminum hydroxide in a state of a slurry after wet grinding. The amount of the slurry is usually from 100 to 220 parts by weight, and preferably from 120 to 200 parts by weight, in terms of the amount of moisture in the slurry based on 100 parts by weight of the aluminum hydroxide. It is not preferred that the amount of moisture is too large since the mixture is converted into a slurry and drying requires large amounts of energy. When the amount of moisture is too small, the mixture has poor fluidity and mixing of the α alumina seed particles with the aluminum hydroxide may becomes insufficient.

(Mixing)

Mixing can be carried out, for example, using a ball mill, a mixer or the like, or carried out by ultrasonic irradiation or the like. These methods enable mixing of the α alumina precursor with the α alumina seed particles with satisfactory dispersibility. In order to mix the α alumina precursor with α alumina seed particles more uniformly, a blade type mixer capable of mixing while applying a shear force is preferable.

The mixture of the α alumina precursor and the α alumina seed particles is usually dried to remove moisture. The drying temperature is usually from 80 to 180° C. In order to improve a light-duty bulk density of the dry product, drying is preferably carried out using a fluidized-bed dryer.

(Calcining)

Calcining can be carried out, for example, using conventional calcining furnaces such as a tubular electric furnace, a box-type electric furnace, a tunnel furnace, a far-infrared furnace, a microwave heating furnace, a shaft furnace, a reverberatory furnace, a rotary furnace, a roller hearth furnace can be used. Calcining can be carried out in either a batchwise or continuous manner. The calcining furnace may be either a stationary or fluidized furnace.

The calcination temperature is usually from 1,200 to 1,450° C., and preferably from 1,250 to 1,400° C., since α alumina (I) having a intended purity, a specific surface area, a relative density, a closed porosity and a bulk density can be easily obtained. When the calcination temperature is too high, calcining may excessively proceeds, resulting in decreased specific surface area and increased closed porosity, contamination with impurities from a calcining furnace is likely to occur. When the calcination temperature is too low, the aluminum hydroxide may not be sufficiently converted into α alumina or the specific surface area may increase.

The rate of rising the temperature to the calcination temperature is, for example, from 30 to 500° C./hour. The calcining time is the time enough to sufficiently convert aluminum hydroxide into α alumina, and varies depending on a ratio of the amount of the aluminum hydroxide to that of the α alumina seed particles, a type of the calcining furnace, a calcination temperature, a calcining atmosphere and the like. For example, the calcining time is from 30 minutes to 24 hours, and preferably from 1 hour to 10 hours.

The calcining atmosphere is preferably an atmospheric air, or an atmosphere of an inert gas such as a nitrogen gas or an argon gas. The calcining atmosphere may also be a wet atmosphere.

(Classification)

Classification can be carried out, for example, by sieving or the like.

<α Alumina (II)>

α alumina (II) is composed of sintered particles. The α alumina (II) of the present invention can be obtained, for example, by forming a mixture of aluminum hydroxide and α alumina seed particles to obtain a green formed body and sintering the obtained green formed body. The α alumina (II) has a specific surface area of 1 $m^2/g$ or less, and preferably 0.1 $m^2/g$ or less. The α alumina (II) has a relative density of 85% or more. The volume of each of the sintered particles is 0.01 $cm^3$ or more, preferably 0.10 $cm^3$ or more, and more preferably 0.10 to 10 $cm^3$. When the specific surface area of the α alumina (II) is too large, or the relative density of the α alumina (II) is too small, the bulk density of the α alumina for the production of a single crystal may decrease.

In order to fill the α alumina for the production of a single crystal in a crucible with high bulk density, the bulk density of an aggregate of sintered particles in the α alumina (II) is preferably from 1 to 3 $g/cm^3$, and the closed porosity is preferably from 0 to 10%. The α alumina (II) preferably has a purity of 99.99% by weight or more. Each content of Si, Na, Ca, Fe, Cu and Mg in the α alumina (II) is preferably 10 ppm or less.

The α alumina (II) can be prepared, for example, by a method including the following steps (II-1) to (II-3):

step of (II-1) mixing aluminum hydroxide with α alumina seed particles to obtain a mixture, step of (II-2) of forming the mixture to obtain a green formed body, and step of (II-3) of sintering the green formed body.

(Aluminum Hydroxide)

Aluminum hydroxide is obtained, for example, by hydrolyzing a hydrolyzable aluminum compound. Examples of the hydrolyzable aluminum compound include aluminum alkoxide, aluminum chloride and the like, and aluminum alkoxide is preferably from the viewpoint of the purity. The aluminum hydroxide is preferably a high-purity aluminum hydroxide having a purity of 99.99% by weight or more. The aluminum hydroxide has a crystal structure of amorphous, gibbsite or boehmite, and preferably boehmite.

(α Alumina Seed Particles)

Examples of the α alumina seed particles include the same α alumina seed particles as those exemplified in the α alumina seed particles of the α alumina (I).

(Mixing)

The α alumina seed particles are usually mixed with aluminum hydroxide in a state of a slurry after wet grinding. The amount of the slurry is usually from 100 to 220 parts by weight, and preferably from 120 to 200 parts by weight, in terms of the amount of moisture in the slurry based on 100 parts by weight of the aluminum hydroxide. It is not preferred that the amount of moisture is too large since the mixture is converted into a slurry and drying requires large amounts of energy. When the amount of moisture is too small, the mixture has poor fluidity and mixing of the α alumina seed particles with the aluminum hydroxide may becomes insufficient. Mixing can be carried out, for example, using a ball mill, a mixer or the like, or carried out by ultrasonic irradiation or the like. These methods enable mixing of the α alumina precursor with the α alumina seed particles with satisfactory dispersibility. In order to mix the α alumina precursor with α alumina seed particles more uniformly, a blade type mixer capable of mixing while applying a shear force is preferable.

(Forming)

The above mixed raw material is formed. The mixed raw material may be adjusted to the amount of moisture suited for forming. For example, the amount of moisture is from 100 to 220 parts by weight, and preferably from 140 to 200 parts by weight, based on 100 parts by weight of the aluminum hydroxide. Forming can be carried out, for example, by press forming, compression forming, extrusion forming, Marmelizer, tumbler or the like. The green formed body usually has a columnar shape, a bale-like shape or a spherical shape. The green formed body may be dried to remove moisture, or not may be dried. Drying can be carried out, for example, by an oven, a high-frequency dryer and the like. The drying temperature is usually from 60 to 180° C.

(Sintering)

Sintering can be carried out, for example, using conventional sintering furnaces such as a tubular electric furnace, a box-type electric furnace, a tunnel furnace, a far-infrared furnace, a microwave heating furnace, a shaft furnace, a reverberatory furnace, a rotary furnace, a roller hearth furnace can be used. Sintering can be carried out in either a batchwise or continuous manner. The sintering furnace may be either a stationary or fluidized furnace.

The sintering temperature is usually from 1,200 to 1,450° C., and preferably from 1,250 to 1,400° C., since a alumina (II) having a intended purity, a specific surface area, a relative density and a closed porosity can be easily obtained. When the sintering temperature is too high, sintering may excessively proceeds, resulting in decreased specific surface area and increased closed porosity, contamination with impurities from a sintering furnace is likely to occur. When the sintering temperature is too low, the aluminum hydroxide may not be sufficiently converted into α alumina or the specific surface area may increase.

The rate of rising the temperature to the sintering temperature is, for example, from 30 to 500° C./hour. The sintering time is the time enough to sufficiently convert aluminum hydroxide into α alumina, and varies depending on a ratio of the amount of the aluminum hydroxide to that of α alumina seed particles, a type of the sintering furnace, a sintering temperature, a sintering atmosphere and the like. For example, the sintering time is from 30 minutes to 24 hours, and preferably from 1 hour to 10 hours.

The sintering atmosphere is preferably an atmospheric air, or an atmosphere of an inert gas such as a nitrogen gas or an argon gas. The sintering atmosphere may also be a wet atmosphere.

The α alumina for the production of a single crystal usually has a specific surface area of 0.1 to 5 $m^2/g$, and preferably 0.2 to 1.0 $m^2/g$. Thereby, less moisture in an atmospheric air adheres to a surface and, in the case of heat-melting, moisture may not cause oxidation of a crucible and also less voids may be formed in a sapphire single crystal.

It is preferred that the α alumina for the production of a single crystal has a purity of 99.99% by weight or more, and each content of Si, Na, Ca, Fe, Cu and Mg is 10 ppm or less. By using such the α alumina for the production of a single crystal as an alumina raw material for the production of a single crystal, a high-quality sapphire single crystal with less coloration or cracking can be obtained.

The α alumina for the production of a single crystal usually has a bulk density of 2.6 $g/cm^3$ or more, and preferably 2.6 to 3.5 $g/cm^3$. It is possible to obtain sapphire single crystal by heat-melting such the α alumina for the production of a single crystal, and then cooling the melted α alumina to easily convert the α alumina into a single crystal.

The α alumina for the production of a single crystal can be used as a raw material of sapphire single crystal growing methods such as an EFG method, a Czochralski method, a Kyropoulos method, and is preferably used in a Czochralski method or Kyropoulos method that requires filling of the raw material in a crucible with high volume efficiency.

[Method for Producing Alpha Alumina for the Production of Single Crystal]

The method for producing α alumina for the production of a single crystal includes the step of mixing 100 parts by weight of α alumina (I) with 25 to 235 parts by weight of α alumina (II), preferably 50 to 150 parts by weight, and more preferably 100 parts by weight.

(Mixing)

In order to suppress contamination of the α alumina, mixing is preferably carried out using an apparatus in which a member in contacted with the α alumina (I) or alumina (II) is made of high-purity α alumina, or lined with a resin.

The present invention will be described in more detail by way of Examples, but the present invention is not limited by these Examples. Methods for evaluation of the respective physical properties are as follows.

(Relative Density)

After measuring a sintered density by the Archimedian method, the relative density was calculated by applying to the equation: relative density (%)=sintered density $[g/cm^3]/3.98$ $[g/cm^3$; α alumina theoretical sintered density$]\times 100$.

(Volume)

The volume was calculated by applying a density of a sintered body measured by the Archimedian method and the weight per one piece of α alumina for the production of a single crystal to the equation: volume ($cm^3$/piece)=weight [g/piece]/sintered density [$g/cm^3$].

(Closed Porosity)

The closed porosity was calculated by the equation: closed porosity (%)=[(volume of opened pores)/{(1/3.98)+volume of pores+volume of closed pores}]×100. The volume of closed pores was calculated by the equation: volume of closed pores ($cm^3/g$)=(1/particle density)−(1/3.98). The particles density was calculated based on the method of measuring a true specific gravity defined in JIS R 7222 (1997). The pore volume was determined by the following procedure. That is, after drying a sample at 120° C. for 4 hours, the pore volume was determined as a pore volume in a pore diameter range of 1 μm or less by a mercury penetration method using AutoPore III 9420 manufactured by Micromeritics Instrument Corporation.

(Concentration of Impurities and Purity)

Each content of Si, Na, Mg, Cu, Fe and Ca was measured by solid-state emission spectroscopy. The purity was determined by calculating the sum total (%) of the weights of $SiO_2$, $Na_2O$, $MgO$, $CuO$, $Fe_2O_3$ and $CaO$ contained in α alumina for the production of a single crystal from the above and subtracting the obtained sum total from 100. Namely, the purity was calculated by the equation: purity (%)=100−sum total (%) of weights of impurities.

(Bulk Density)

The bulk density was determined by filling a sample in a container measuring 80 mm in inner diameter and 150 mm in height and then calculating by dividing the weight of the sample by the volume of a measuring container.

(Specific Surface Area)

The specific surface area was measured by a nitrogen absorption method using a BET specific surface area analyzer "2300-PC-1A" manufactured by Shimadzu Corporation. A sample, which cannot be accommodated in the measuring container, was measured after grinding into the size enough to be accommodated in the container.

(Particle Size Distribution)

Based on a dry sieving test method defined in JIS K 0069 (1992), the particle size distribution was calculated using sieves each having a sieve mesh size of 75 μm, 100 μm, 212 μm, 300 μm, 425 μm, 500 μm, 600 μm, 710 μm, 850 μm, 1 mm, 2 mm or 2.8 mm among standard sieves specified in JIS Z 8801 (1987).

(Moisture Amount)

The amount of adsorbed moisture was determined by drying a sample at 110° C. based on JIS H 1901 (1997) and then measuring as the weight loss.

EXAMPLES

<Preparation of α Alumina (I)>

As α alumina seed particles, high-purity α alumina having a purity of 99.99% by weight (manufactured by Sumitomo Chemical Company, Limited. under the trade name of "AKP-53") was used. Water was added to the high-purity α alumina to obtain a mixture and the mixture was ground using a wet ball mill to prepare a slurry containing alumina seed particles of 25% by weight. The α alumina seed particles had a central particle diameter of 0.25 μm.

As an α alumina precursor, high-purity aluminum hydroxide having a purity of 99.99% by weight obtained by a method of hydrolyzing an aluminum alkoxide was used. The high-purity aluminum hydroxide has a crystal structure of boehmite.

The slurry and the high-purity aluminum hydroxide were mixed by a blade type mixer including a stirring blade having a highly-rotating multi-stage cross-type decomposition structure provided inside a surface. The amount of the α alumina seed particles in the slurry was 1.7 parts by weight assumed that the amount of the a alumina coarse powder obtained by calcining is 100 parts by weight. The amount of water was 149 parts by weight based on 100 parts by weight of the high-purity aluminum hydroxide.

After mixing, moisture was removed by drying at 200° C. using a fluidized-bed dryer, and then the obtained mixture was calcined at a temperature rise rate of 100° C./hour and a calcination temperature of 1,335° C. for 4 hours. Calcining was carried out in an atmospheric air. The obtained coarse powder was classified by sieving to obtain α alumina (I).

The obtained α alumina (I) was in the form of a powder, and had a Si content of 6 ppm, a Na content of 5 ppm or less, an Mg content of 1 ppm or less, a Cu content of 1 ppm or less, a Fe content of 6 ppm, a Ca content of 1 ppm or less, and an alumina purity of 99.99% by weight.

Also, the α alumina (I) was in the form of an a alumina powder which has a relative density of 87%, a closed porosity of 2.4%, a specific surface area of 0.4 m$^2$/g, a bulk density of 2.5 g/cm$^3$ and an amount of adsorbed moisture of 0.02% by weight and contains less adsorbed moisture, and also has a low closed porosity and a high bulk density.

The α alumina (I) contained 2.0% by weight of particles having a particle diameter of less than 75 μm and 4.6% by weight of particles having a particle diameter of more than 2.8 mm and exhibited one frequency maximum (A) in a particle diameter range of 100 μm or more and less than 212 μm; and also contained 3.4% by weight of particles having a particle diameter of 850 μm or more and less than 1 mm and exhibited one frequency maximum (B) in a particle diameter range of 1 mm or more and less than 2 mm in particle size distribution on a weight basis; and D2 was 10 time of D1; and a ratio M1/M2 was 1.19.

<Preparation of α Alumina (II)>

As α alumina seed particles, high-purity α alumina having a purity of 99.99% by weight (manufactured by Sumitomo Chemical Company, Limited under the trade name of "AKP-53") was used. Water was added to the high-purity a alumina to obtain a mixture and the mixture was ground using a wet ball mill to prepare a slurry containing 25% by weight of alumina seed particles. The α alumina seed particles had a central particle diameter of 0.25 μm.

As aluminum hydroxide, a high-purity aluminum hydroxide having a purity of 99.99% by weight obtained by a method of hydrolyzing an aluminum alkoxide was used. The high-purity aluminum hydroxide has a crystal structure of boehmite.

The slurry and the high-purity aluminum hydroxide were mixed by a blade type mixer including a stirring blade having a highly-rotating multi-stage cross-type decomposition structure provided inside a surface. The amount of the α alumina seed particles in the slurry was 1.7 parts by weight assumed that the amount of the α alumina obtained by calcining is 100 parts by weight. The amount of water was 149 parts by weight based on 100 parts by weight of the aluminum hydroxide.

After adjusting the amount of water to 192 parts by weight relative to 100 parts by weight of the aluminum hydroxide, the mixture was extrusion-formed into a columnar shape measuring 20 mm in a diameter and 40 mm in length. The green formed body was dried in an oven at 60° C. to remove moisture and then sintered at a temperature rise rate of 100° C./hour and a sintering temperature of 1,350° C. for 4 hours to obtain α alumina (II). Sintering was carried out in an atmospheric air.

The obtained α alumina (II) was composed of sintered particles, and had a specific surface area of 0.1 m$^2$/g or less, a relative density of 94%, each volume of sintered particles of 1.1 cm$^3$, a bulk density of 1.8 g/cm$^3$, a closed porosity of 6%, a Si content of 4 ppm, a Na content of 5 ppm or less, an Mg content of 1 ppm or less, a Cu content of 1 ppm or less, a Fe content of 5 ppm, a Ca content of 1 ppm or less, and an alumina purity of 99.99% by weight.

<Mixing of α Alumina (I) and α Alumina (II)>

The obtained 100 parts by weight of the α alumina (I) was mixed with 100 parts by weight of α alumina (II) to obtain α alumina for the production of a single crystal. The obtained α alumina for the production of a single crystal had a bulk density of 3.0 g/cm$^3$, and the bulk density was high. Accordingly, it is found that the obtained α alumina for the production of a single crystal can be filled in a crucible with high volume efficiency and thus a sapphire single crystal can be produced with high production efficiency.

Also, the obtained α alumina for the production of a single crystal had a specific surface area of 0.2 m$^2$/g, a Si content of 6 ppm, a Na content of 5 ppm or less, an Mg content of 1 ppm or less, a Cu content of 1 ppm or less, a Fe content of 6 ppm, a Ca content of 1 ppm or less, and an alumina purity of 99.99% by weight.

What is claimed is:

1. α-alumina for the production of a sapphire single crystal, comprising 100 parts by weight of α-alumina (I) and 25 to 235 parts by weight of α-alumina (II), the α-alumina (I) having a specific surface area of 0.1 to 5 m$^2$/g and a bulk density of 1.5 g/cm$^3$ or more, the α-alumina (II) being composed of sintered particles, and having a specific surface area of 1 m²/g or less and a relative density of 85% or more, each of the sintered particles having a volume of 0.01 cm³ or more.

2. The α-alumina for the production of a sapphire single crystal according to claim 1, wherein the α-alumina (I) exhibits one or more frequency maximums in a particle diameter range of 100 μm to less than 850 μm in particle size distribution on a weight basis of a dry sieving particle diameter.

3. The α-alumina for the production of a sapphire single crystal according to claim 1, wherein the α-alumina (I) contains 10% by weight or less of particles having a particle diameter of 850 μm to less than 1 mm in particle size distribution on a weight basis of a dry sieving particle diameter, wherein the α-alumina (I) exhibits one or more frequency maximums (A) in a particle diameter range of 100 μm to less than 850 μm and the α-alumina (I) exhibits one or more frequency maximums (B) in a particle diameter range of 1 mm or more, and wherein when D1 denotes a maximum particle diameter of a frequency maximum showing the smallest maximum particle diameter among the frequency maximums (A), M1 denotes a maximum value of a frequency maximum showing the smallest maximum particle diameter among the frequency maximums (A), D2 denotes a maximum particle diameter of a frequency maximum showing the largest maximum particle diameter among the frequency maximums (B) and M2 denotes a maximum value of a frequency maximum showing the largest maximum particle diameter among the frequency maximums (B), D1 and D2 satisfy the inequality expression: $2 \times D1 \leqq D2 \leqq 20 \times D1$ and a ratio of M1 to M2 is 0.05 or more.

4. The α-alumina for the production of a sapphire single crystal according to claim 1, having a purity of 99.99% by weight or more, each content of Si, Na, Ca, Fe, Cu and Mg being 10 ppm or less by weight.

5. A method for producing α-alumina for the production of a sapphire single crystal, comprising the step of mixing 100 parts by weight of α-alumina (I) with 25 to 235 parts by weight of α-alumina (II), wherein the α-alumina (I) has a specific surface area of 0.1 to 5 m²/g and a bulk density of 1.5 g/cm³ or more, the α-alumina (II) is composed of sintered particles and has a specific surface area of 1 m²/g or less and a relative density of 85% or more, and each of the sintered particles has a volume of 0.01 cm³ or more.

* * * * *